US012660098B2

(12) United States Patent (10) Patent No.: US 12,660,098 B2
Clauberg (45) Date of Patent: Jun. 16, 2026

(54) ELECTRICAL ENCLOSURE FOR A LED DRIVER

(71) Applicant: SIGNIFY HOLDING B.V., Eindhoven (NL)

(72) Inventor: Bernd Clauberg, Schaumburg, IL (US)

(73) Assignee: SIGNIFY HOLDING B.V., Eindhoven (NL)

( * ) Notice: Subject to any disclaimer, the term of this patent is extended or adjusted under 35 U.S.C. 154(b) by 164 days.

(21) Appl. No.: 18/293,273

(22) PCT Filed: Jul. 27, 2022

(86) PCT No.: PCT/EP2022/071105
§ 371 (c)(1),
(2) Date: Jan. 29, 2024

(87) PCT Pub. No.: WO2023/006829
PCT Pub. Date: Feb. 2, 2023

(65) Prior Publication Data
US 2024/0341044 A1 Oct. 10, 2024

Related U.S. Application Data

(60) Provisional application No. 63/226,831, filed on Jul. 29, 2021.

(30) Foreign Application Priority Data

Aug. 9, 2021 (EP) ..................................... 21190256

(51) Int. Cl.
*H05K 5/00* (2025.01)
*H05B 45/30* (2020.01)
(52) U.S. Cl.
CPC ........... *H05K 5/0026* (2013.01); *H05B 45/30* (2020.01)

(58) Field of Classification Search
CPC ......... B65D 2517/01014; F21V 23/007; F21V 29/508; F21V 15/01; H05K 5/0026;
(Continued)

(56) References Cited

U.S. PATENT DOCUMENTS 5,594,207 A * 1/1997 Fabian ................... H02G 3/086
174/53
6,362,971 B1 3/2002 Skofljanec
(Continued)

FOREIGN PATENT DOCUMENTS

CN 205717088 U 11/2016
CN 208268812 U 12/2018
(Continued)

*Primary Examiner* — Sagar Shrestha
*Assistant Examiner* — Peter Krim

(57) ABSTRACT

The present invention provides an electrical enclosure for an LED driver and grounding the electrical enclosure. The electrical enclosure includes a base plate having substantially planar bottom surface, with a plurality of mounting apertures on the base plate on a first and second ends of the base plate, wherein a center portion of the base plate between the first and second ends is opened allowing exposure to the surrounding ambient air. At least one of the first and second ends having first and second sections/tabs that are respectively punched out and folded to create openings in the base, wherein the second section's folded section/tab covers a portion of the opening created by the first section, and wherein the mounting apertures on the first and second ends of the electrical enclosure providing for securement of the electrical enclosure to a luminaire or other mounting surface, and said center portion for receiving the LED driver.

11 Claims, 1 Drawing Sheet

(58) Field of Classification Search
CPC .... H05K 5/02; H05K 5/0217; F21Y 2115/10;
H05B 45/30; H02G 3/081; H02G 3/083;
H02G 3/085
USPC ........................................... 220/6, 7, 8, 4.02
See application file for complete search history.

(56)　　　　　　References Cited

U.S. PATENT DOCUMENTS

| | | | | |
|---|---|---|---|---|
| 9,170,000 | B2 * | 10/2015 | Quaal | F21V 29/70 |
| 9,518,706 | B2 * | 12/2016 | Chan | F21V 15/013 |
| 10,116,127 | B1 * | 10/2018 | Lopez-Martinez | H02G 3/088 |
| 11,387,639 | B2 * | 7/2022 | Johnson | H02G 3/16 |
| 2017/0268758 | A1 * | 9/2017 | Buck | F21V 23/001 |
| 2018/0195704 | A1 | 7/2018 | Lyman | |

FOREIGN PATENT DOCUMENTS

| | | | |
|---|---|---|---|
| DE | 102009009496 A1 | 9/2009 | |
| WO | 2020002289 A1 | 1/2020 | |
| WO | 2020022889 A1 | 1/2020 | |

* cited by examiner

ELECTRICAL ENCLOSURE FOR A LED DRIVER

CROSS-REFERENCE TO PRIOR APPLICATIONS

This application is the U.S. National Phase application under 35 U.S.C. § 371 of International Application No. PCT/EP2022/071105, filed on Jul. 27, 2022, which claims the benefit of European Patent application Ser. No. 21/190, 256.4, filed on Aug. 9, 2021, and U.S. Application No. 63/226,831, filed Jul. 29, 2021. These applications are hereby incorporated by reference herein.

TECHNICAL FIELD

The present invention relates generally to the construction of an electrical enclosures that may also including a mounting bracket for housing electrical power components and, more particularly, to a tray-type electrical enclosure platform for housing power supplies, LED drivers and other electrical components.

Due to most users of lighting fixtures becoming energy-saving conscious, as well as an increase in energy regulations, LEDs or light-emitting diodes is increasing in Demand. LEDs are designed to operate using a low voltage direct current and alternating current. When direct current types are used an LED driver must be used to convert the input alternating current to output direct current.

Because of the aforementioned issue of supplying low-rated voltage and the required direct current, it is necessary to include an LED driver, also known as an LED power supply with LED light fixture. LED drivers rectify higher voltages (120V) alternating currents into a lower voltage direct current. LED drivers come in two types: (a) an internal LED driver incorporated into the LED bulb; internal LED drivers are common in household bulbs, and (b) an external LED driver, as the name indicates, is not incorporated into the LED bulb or a bank of LED bulbs. External LED drivers are common with LEDs, such as, downlights, tape lights, cove lights, and general illumination fixtures for indoor and outdoor applications.

In recent years, the use of LED's has become prevalent in today's society, and are used in residential, industrial and commercial applications. It has been ascertained that external LED driver's life expectancy are reduced as a result of high internal operating temperatures. To circumvent such a problem, designers of LED drivers often include a heat sink to dissipate excess heat and prolong the life of the LED.

Currently, many LED drivers with electrical enclosures have a metal housing that use various techniques to ground the metal housing to earth and to the printed circuit board (PCB) such that Y-capacitors can be electrically connected. Some use separate grounding wires, some connect a clip that gets soldered into the PCB and then mechanically connects to the can cover which then connects to the base of the housing. However, the wire as well as the method of connecting from the PCB to the cover and then the base, create a relatively long path between the PCB and earth. This results in a relatively poor high frequency connection. The purpose of the grounding the PCB Y-capacitors to the earth is to reduce EMI emissions from the driver leads. If the grounding method does not provide a good high frequency path (e.g. too much inductance), then the Y-capacitors cannot properly filter these frequencies and poor EMC performance results. One method to overcome this long ground power is to directly bend up a piece of the housing base such that it protrudes through the PCB and can directly connect to a jumper wire on the PCB. This provides a method to get a very short, low inductance grounding path. However, this method requires a section of the base housing to be folded up, leaving a hole in the bottom of the metal housing. Adding a separate lose piece of metal to cover the hole is not desired and welding or riveting such a pieces adds additional cost and process steps in the manufacturing of the metal housing.

Moreover, some standards bodies also have restrictions on the size of housing openings in LED driver enclosures. For example, the North American ANSI/UL 8750 standard is the Light Emitting Diode (LED) Equipment for Use in Lighting Products. The LED equipment includes not only LED drivers, but also LED modules, LED controllers, and so on. North American ANSI/UL 8750 standard is incorporated by reference herein.

North American ANSI/UL 8750 standard states in part:

"Drivers that are not otherwise restricted by requirements in 6.4 may have openings as follows:

1) Circular openings have a diameter not exceeding 3 mm (0.12 in) and minimum spacing between circular openings is 3 mm (0.12 in), 2) Rectangular (or square) openings is 3 mm (0.12 in0 across and 30 mm (1.18 in) in length"

To make the above method of directly bend up a piece of the housing base of the LED driver enclosure mechanically feasible, the hole must be roughly 8 mm×6 mm in size which is larger than the allowed opening listed in the UL standards, for example.

SUMMARY OF THE INVENTION

The present invention relates to an electrical enclosure for a LED driver for mounting high-output LED drivers units, and other power supplies used in existing light fixtures, such as, for example, shoe-box parking lot fixtures, canopy fixtures, street light fixtures, flat panel fixtures, recessed and surface mounted types of fixtures. Specifically, the electrical enclosure provides efficient electrical grounding of the LED driver that is compliant with various industry standards.

The present invention is set out in the appended set of claims. The invention as defined in claim 1 as an electrical enclosure that comprises a base for housing an LED driver; the electrical enclosure includes an uncovered area open to the ambient surroundings that houses the LED driver, the base includes first and second sections/tabs that are respectively punched out and fold up to create openings in the base, wherein the second section's fold up portion/tab covers a portion of the opening created by the first section.

As provided above, the second tab is punched out and fold up in the housing base next to the first opening created by the first tab (which can be larger than the second tab). In this manner, the larger opening (first section) is partially covered (with a strip of metal) by the second section. This effectively splits the opening in the housing base into 2 sections which separately both meet the UL requirements, for example. For larger openings, more sections can be used to split the hole into many sections, each meeting the hole size restrictions from the various standards bodies.

Additional features and advantages of the present invention are described in, and will be apparent from, the detailed description of the presently preferred embodiments and from the drawings.

BRIEF DESCRIPTION OF THE DRAWINGS

In order to facilitate a full understanding of the present invention, reference is now made to the accompanying drawings, in which like elements are referenced with like numerals. These drawings should not be construed as limiting the present invention, but are intended to be exemplary and for reference.

FIG. 1(*b*) is a bottom view of a LED electrical enclosure according to an embodiment of the present invention.

DETAILED DESCRIPTION

The present invention will now be described in more detail with reference to exemplary embodiments as shown in the accompanying drawings. While the present invention is described herein with reference to the exemplary embodiments, it should be understood that the present invention is not limited to such exemplary embodiments. Those possessing ordinary skill in the art and having access to the teachings herein will recognize additional implementations, modifications, and embodiments, as well as other applications for use of the invention, which are fully contemplated herein as within the scope of the present invention as disclosed and claimed herein, and with respect to which the present invention could be of significant utility.

The present invention is an electrical enclosure for a LED driver for mounting high-output LED drivers units, which is used to attach the fixture housing. The electrical enclosure includes a base plate that has a front face with an opening for receiving integral splice/wiring for the LED driver and a plurality of holes for securing the LED driver to the electrical enclosure using screws or other fastening means.

Figure 1A:
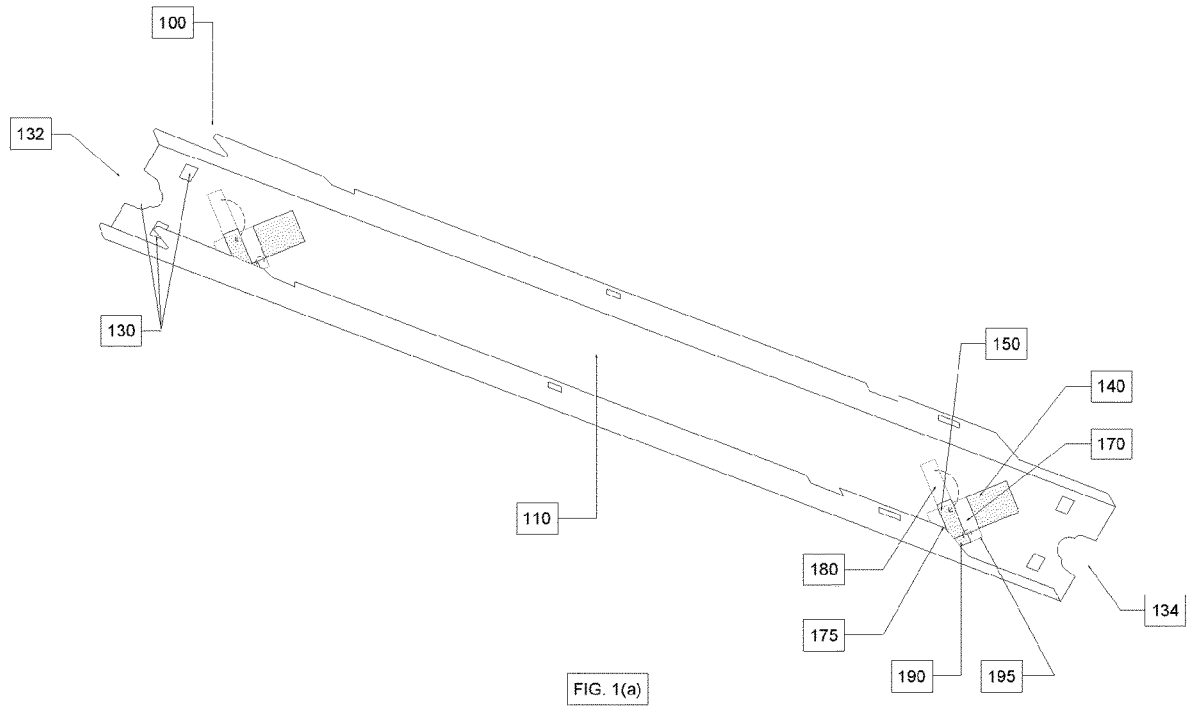
FIG. 1(*a*) is a top perspective view of a LED electrical enclosure according to an embodiment of the present invention.
Figure 1B:
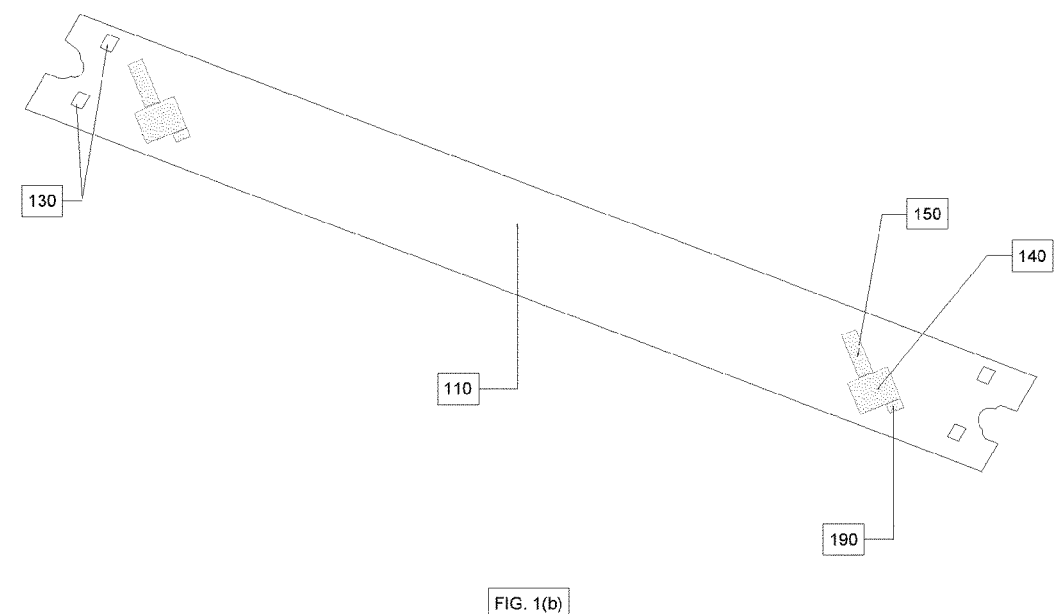

In one embodiment and in reference to FIG. 1(*a*) shows a top perspective view of an embodiment of the electrical enclosure 100 used for an LED driver (not shown). The electrical enclosure 100 includes a substantially planar base 110 with a number of holes 130, on each end (first end 132 and second end 134) of the electrical enclosure 100 for securing the circuit board assembly into the housing (PCB standoffs) and for securing the housing to a fixture housing. For safely securing the electrical enclosure 100 to the fixture housing, either side of the electrical enclosure 100 may be securely mounted by screwing two screws. A cover snaps into the shown enclosure base (100) using snap features on the side walls (cover not shown).

The base 110 includes at least first and second sections/tabs (140, 150) that are respectively punched out and are then fold up to create openings 170, 180 in the base, wherein the second section's fold up portion/tab 150 covers a portion of the opening 170 created by the first section 140.

The first and second section/tabs (140, 150) can be any polygon shape, including circular, rectangular, triangle or square.

The second tab 150 is punched and fold up next to the housing base 110 and next to the first opening 170 created by the first tab 140 (which can be larger than the second tab 150). In this manner, the larger opening (first section/tab 170) is partially covered (with a strip of metal) by the second section/tab 180. This effectively splits the opening in the housing base into two sections which separately both meet the UL requirements, for example. For larger openings, more sections can be used to split the hole into many sections, each meeting the hole size restrictions from the various standards bodies.

Also shown in FIG. 1(*a*) a third section/tab 190 with a corresponding opening 195. The third section/tab is added to mechanically support the end of the second section/tab 150

(e.g. metal strip) to ensure that it cannot be easily folded up. It can be just a few millimeters in size, just enough to grab the tip of the second section/tab and hold it in place. This third section/tab is optional depending on the mechanical strength of the folded second section/tab (150). In the exemplarity embodiment shown in FIGS. 1(*a*) and 1(*b*), a square is shown for the first section/tab (140) and a rectangular for section/tab (150). To meet the UL requirement, the openings must not exceed 3 millimeters (mm) (0.12 inch) across/width and 30 mm (1.18 in) in length. In this example, if the opening is 6 mm wide, a 2.9 mm strip of 15 mm or so could be used. This second section/tab (150) is folded over the opening made by the first section/tab (140) [6×8 mm hole] as shown in FIG. 1(*a*). All three openings satisfy the UL 8750 standard requirements.

To make the above method of directly fold up a piece of the housing base of the LED driver enclosure mechanically feasible, the hole must be roughly 8 mm×6 mm in size which is larger than the allowed opening listed in the UL standards, for example.

Advantageously, no addition material is used to cover the opening and no different fasteners (rivets or welding) are needed to cover a portion of the opening to comply with industry standards (in particular, for LED drivers that require high frequency grounding via the base of the LED driver housing and must meet the UL 8750 hole size requirement).

Importantly, the base plate (110) is electrically coupled to ground and to a printed circuit board (PCB) of the LED driver, such that Y-capacitors can be electrically connected, using a jumper wire and one or of the openings created by the first (140) and second (150) sections/tabs. This provides very short, low inductance grounding path, without the need of adding a separate lose piece of metal to cover the hole.

FIG. 1(*b*) is a bottom view of the electrical enclosure 100 used for an LED driver (not shown). And shows the first, second and third sections/tabs 140, 150 and 190, respectively, in an unpunched state.

It will be appreciated by one of skill in the art that an electrical enclosure for a LED driver of the present invention may be set up to safely and securely hold various size of LED driver cases and wattages.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Moreover, any combination of the above-described elements in all possible variations thereof is encompassed by the invention unless otherwise indicated herein or otherwise clearly contradicted by context.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An electrical enclosure for an LED driver comprising:
   a base plate having substantially planar bottom surface, with a plurality of mounting apertures on the base plate on a first and second ends of the base plate, wherein a center portion of the base plate between the first and second ends is opened allowing exposure to the surrounding ambient air;
   at least one of the first and second ends having first and second sections/tabs that are respectively punched out and folded to create openings in the base, wherein the second section's folded section/tab covers a portion of the opening created by the first section,
   said mounting apertures on the first and second ends of the electrical enclosure providing for securement of the electrical enclosure to a luminaire or other mounting surface, and said center portion for receiving the LED driver.

2. The electrical enclosure as claimed in claim 1, wherein the second section/tab is punched out and fold next to the housing base and over a portion of the first opening created by the first section/tab, wherein the first section/tab is larger than the second section/tab, and creating three openings in the base plate.

3. The electrical enclosure as claimed in claim 2, wherein all three opening separately have predetermined dimensions.

4. The electrical enclosure as claimed in claim 3, wherein all three opening separately have dimensions not exceeding 3 millimeters width and 30 millimeters in length or 3 millimeters in diameter.

5. The electrical enclosure as claimed in claim 2, wherein all three opening separately meet the North American ANSI/UL 8750 standard (Light Emitting Diode Equipment for Use in Lighting Products) housing/enclosure opening requirements.

6. The electrical enclosure as claimed in claim 2, further including a third section/tab with a corresponding opening, wherein the third section/tab mechanically support and end of the second section/tab.

7. The electrical enclosure as claimed in claim 2, further including a third section/tab with a corresponding opening, wherein the third section/tab folded section/tab covers a portion of the opening created by the first or second section/tab.

8. The electrical enclosure as claimed in claim 2, wherein the a base plate and the first and second section/tabs are made of metal.

9. The electrical enclosure as claimed in claim 1, wherein the first and second section/tabs can be any polygon shape, including circular, rectangular, triangle or square.

10. The electrical enclosure as claimed in claim 1, wherein the base plate is electrically coupled to ground and to a printed circuit board of the LED driver, such that Y-capacitors can be electrically connected, using a jumper wire and one of the openings.

11. The electrical enclosure of claim 1, wherein the center portion is opened allowing the LED driver to be exposed to the surrounding ambient air for decreasing the operating temperature of the LED driver.

* * * * *